United States Patent [19]

Akamatsu

[11] 4,338,617

[45] * Jul. 6, 1982

[54] FOUR TERMINAL GTO THYRISTOR WITH TRANSISTOR CONTROLLED TURN-OFF

[75] Inventor: Masahiko Akamatsu, Amagasaki, Japan

[73] Assignee: Mitsubishi Denki Kabushiki Kaisha, Tokyo, Japan

[*] Notice: The portion of the term of this patent subsequent to Aug. 15, 1995, has been disclaimed.

[21] Appl. No.: 89,156

[22] Filed: Oct. 29, 1979

Related U.S. Application Data

[63] Continuation of Ser. No. 911,717, Jun. 21, 1978, abandoned, which is a continuation of Ser. No. 743,670, Nov. 22, 1976, abandoned.

[30] Foreign Application Priority Data

Feb. 12, 1976 [JP] Japan ................................ 51-14200

[51] Int. Cl.$^3$ .......................................... H01L 29/74
[52] U.S. Cl. ........................................ 357/38; 357/39;
357/86; 307/252 J; 307/252 M; 307/305
[58] Field of Search ............................ 357/38, 86, 39;
307/252 M, 252 J, 305

[56] References Cited

U.S. PATENT DOCUMENTS

| | | | |
|---|---|---|---|
| 3,590,339 | 6/1971 | Bilo et al. ............................... | 357/38 |
| 3,619,652 | 11/1971 | Ogle ....................................... | 307/305 |
| 3,725,752 | 4/1973 | Garrett ................................... | 357/38 |
| 4,107,552 | 8/1978 | Akamatsu ........................ | 307/252 J |

Primary Examiner—Joseph E. Clawson, Jr.

Attorney, Agent, or Firm—Oblon, Fisher, Spivak, McClelland & Maier

[57] ABSTRACT

A semiconductor element comprises the first conductive type first semiconductor layer (11) which has an exposed surface at the first surface side to contact with the first contact (21);

the second conductive type second semiconductor layer (12) which forms the first PN junction $J_1$, with the first semiconductor layer (11) and has an exposed surface at the first surface side to contact with the first contact (21);

the first conductive type third semiconductor layer (13) which forms the second PN junction $J_2$ with the semiconductor layer (12) and has an exposed surface at the second surface side; and the fourth semiconductor layer (14) which forms the third PN junction $J_3$ with the third semiconductor layer (13) and has an exposed surface at the second surface side;

wherein the exposed surface of the third semiconductor layer (13) includes the exposed surface faced substantially to the exposed surface of the second semiconductor layer (12) and is brought into ohmic contact with the third B contact (23b) and the exposed surface of the fourth semiconductor layer (14) includes the first part (14a) which is faced to the first semiconductor layer (11) and is brought into ohmic contact with the third A contact (23a) and the second part (14b) which is faced to the exposed surface of the second semiconductor layer (12) and is brought into ohmic contact with the second contact (22); and the first contact (21), the second contact (22), the third A contact and the third B contact are lead out.

5 Claims, 34 Drawing Figures

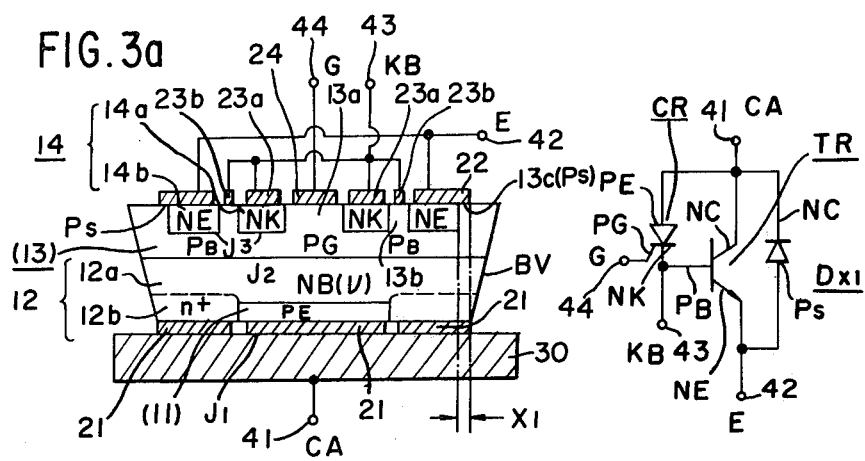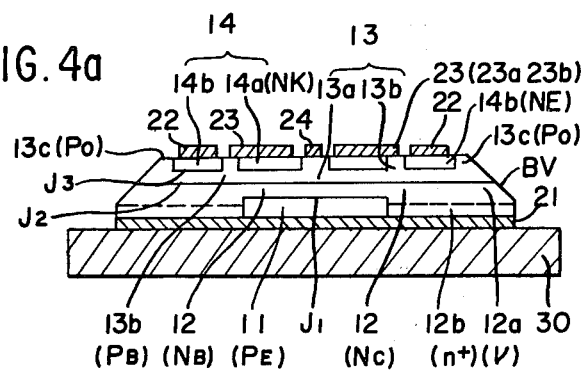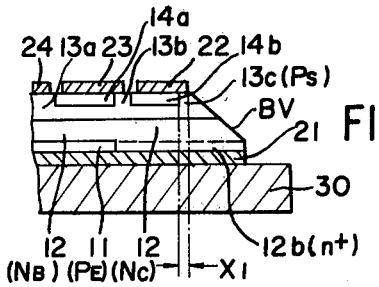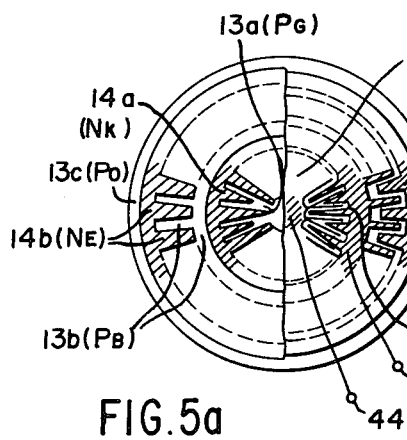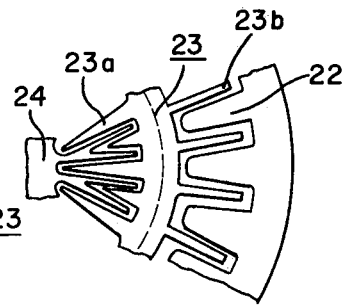

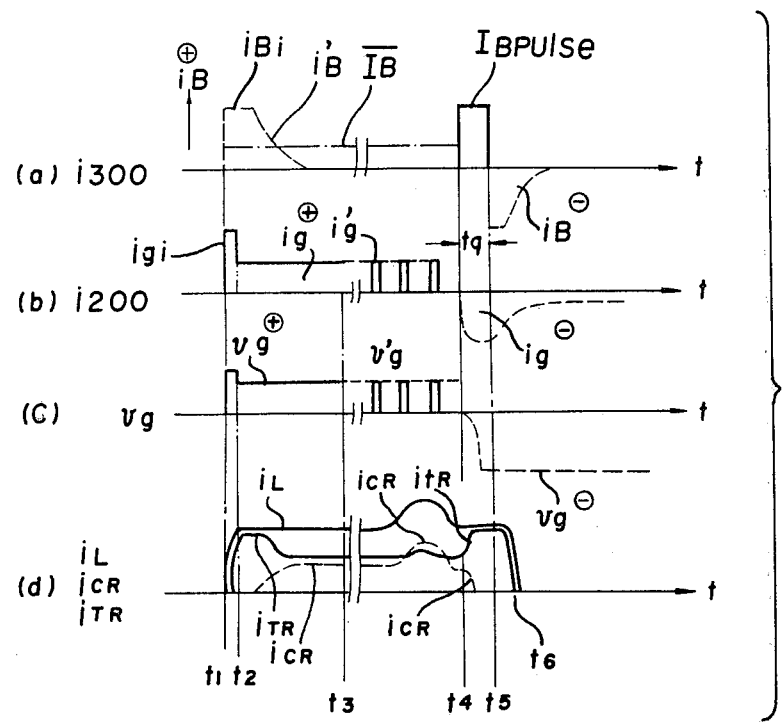
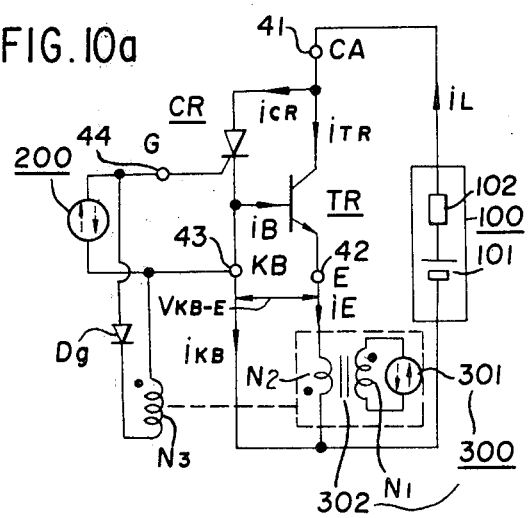
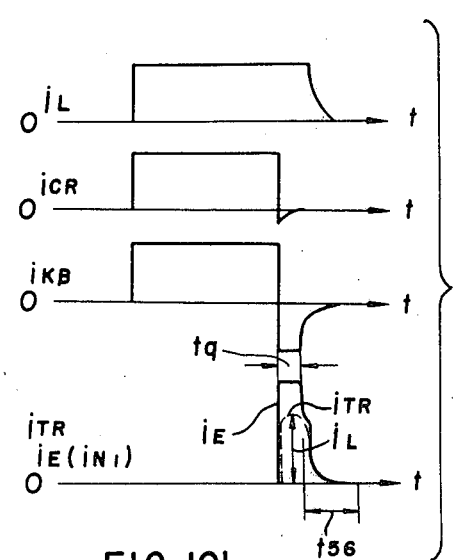

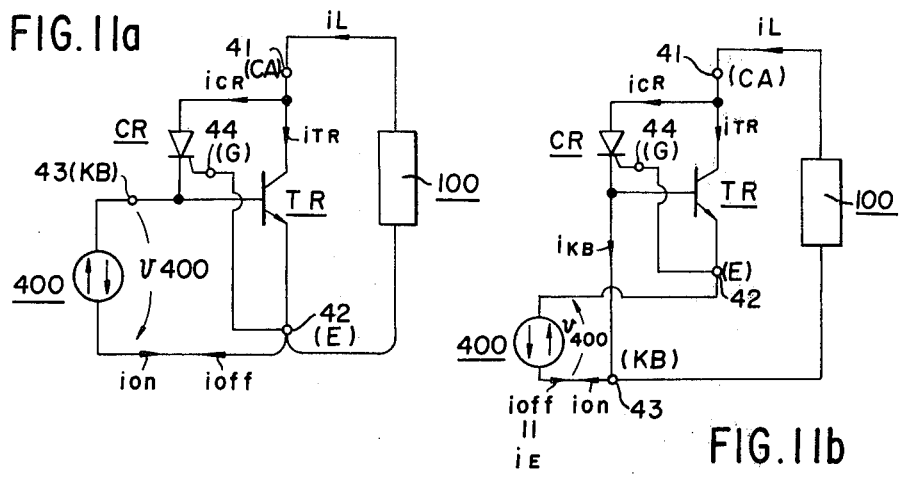
FIG.11a
FIG.11b
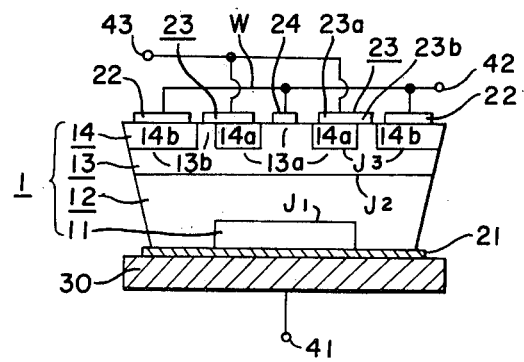
FIG.12a
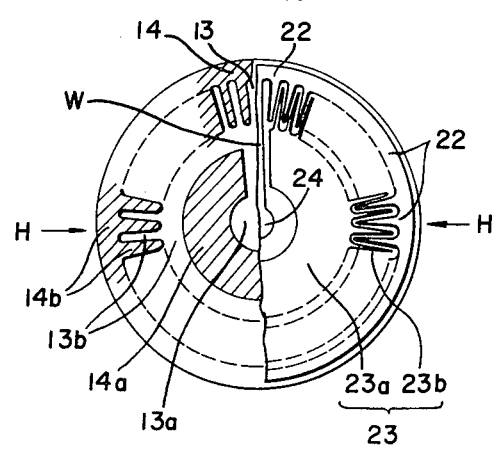
FIG.12b

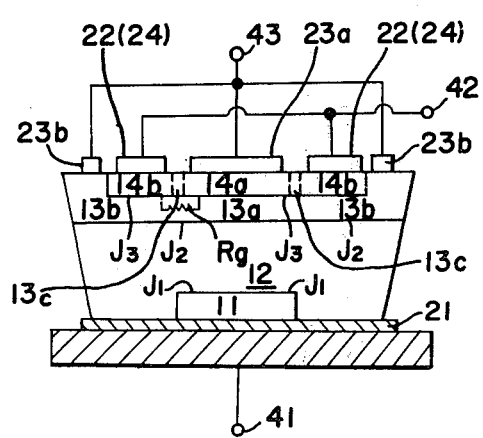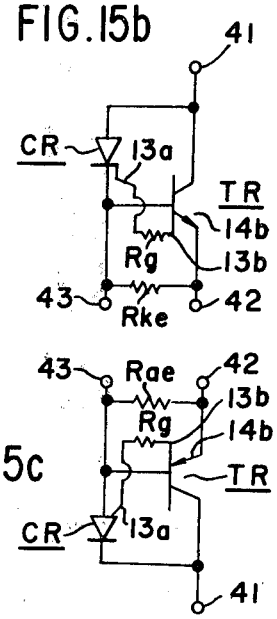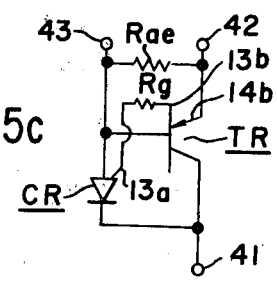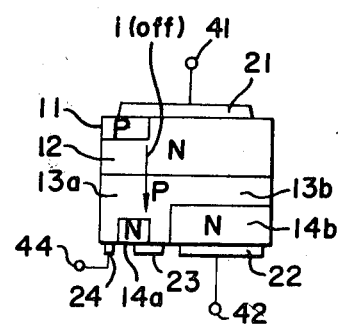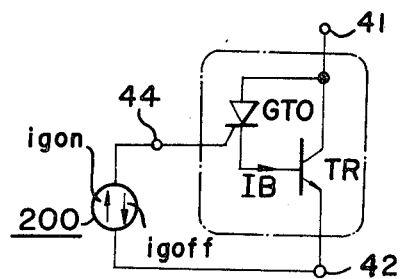

FOUR TERMINAL GTO THYRISTOR WITH TRANSISTOR CONTROLLED TURN-OFF

This is a continuation, of application Ser. No. 911,717, filed June 2, 1978 abandoned, which is a continuation of U.S. Application Ser. No. 743,670 filed Nov. 22, 1976, now abandoned.

BACKGROUND OF THE INVENTION

The present invention relates to a power semiconductor switching device.

It has been known to use a thyristor, a gate turn-off thyristor and a transistor as a power semiconductor switching device.

The thyristor has not a self turn-off function. The gate turn-off thyristor is easily destroyed by the turn-off switching power whereby it is difficult to attain a large capacity. It is difficult to prepare a transistor having high voltage and large current because of the contradiction of the increase of breakdown voltage to the increase of current amplification factor.

It has been proposed to use a complex switching device wherein a gate turn-off thyristor is connected between the base-collector of the transistor whereby the transistor is turned off depending upon the turn-off caused by the gate of the gate turn-off thyristor.

FIGS. 16(a), (b) are respectively a sectional view of the conventional structure of the connection of the gate turn-off thyristor GTO and the transistor TR and the circuit diagram thereof.

The conventional structure comprises a three layer transistor part TR and a four layer gate turn-off thyristor GTO and the gate turn-off thyristor turns on and off the base current $I_B$ of the transistor.

Since the turn-off by the gate of the gate turn-off thyristor is difficult, it is necessary to increase the current amplification factor $h_{FE}$ of the transistor TR and to decrease the required base current $I_B$ for moderating the turn-off condition, because the current capable of turn-off of GTO by the gate, that is the OFF capable current per unit area of the semiconductor wafer (current density) is one order smaller than that of the thyristor which need not have the turn-off capability, and is one of several to that of the transistor.

Accordingly, the area of the semiconductor wafer for GTO is too large except lowering the current for passing through GTO and the required base current $I_B$ of the transistor.

In order to increase the current amplification factor $h_{FE}$ of TR, it is necessary to give thinner thickness of the base layer (13b) of TR part when the semiconductor having the same impurity is used.

However, the gate layer (13a) of the four layer GTO part should be thick because of the turn-off purpose and the four layer structure.

When their thicknesses are the same, the gate layer (13a) of GTO part and the base layer (13b) of TR part should have different impurity structures.

Such contradiction of the three layer TR part to the four layer GTO part is caused in the other semiconductor layers (12) (14, 14a, 14b).

Accordingly, the manufacture of the conventional element shown in FIG. 16 is complicated.

Moreover, in the conventional device of FIG. 16, it is difficult to increase the breakdown voltage of the three layer TR part. In order to improve the current amplification factor $h_{FE}$, it is necessary to increase the diffusion distance of the base layer (13b) or to give thinner thickness or to give fine projected parts of the base contact.

These structures cause the breakdown voltage and the collector sustaining voltage $V_{CE}$ (sustaining) required for the turn-off step to decrease and cause higher nonuniformity in the layer, and an increase in the fault rate in the manufacture thereof.

When the breakdown voltage is increased ($V_{CEO(sus)} \geq 600$), the current density per unit area should be remarkably decreased. Accordingly, the high voltage-large current semiconductor element is remarkably uneconomical in comparison with a simple high speed thyristor. Accordingly, the high voltage semiconductor elements have been practically used when they are small current semiconductor element (several ampers).

The safety operation region is narrow because the collector sustaining voltage is low and the thickness of the base layer is thin to cause nonuniformity (high collector loss and tendency of local concentration of switching power).

The embodiment of FIG. 16 has the disadvantages of the transistor.

As stated above, the disadvantage of the embodiment of FIG. 16 is based on the fact that the four layer GTO part is turned off by only the gate. The three layer TR part does not substantially contribute in the turn-off operation as quality and contributes only for the amplification as quantity. Accordingly, when the current amplification factor of the three layer TR part is decreased, it is difficult to attain the turn-off by the gate of the four layer GTO part.

In the embodiment of FIG. 16, the current of TR is decreased depending upon the decrease of the current of GTO in the step of the turn-off of GTO, whereby the voltage across the main electrodes (41) and (42) is increased. Accordingly, the voltage rise is caused for decreasing the current. The turn-off switching power fed into GTO is not improved for GTO itself in comparison with the single GTO for the same current density (single GTO for the same current with the GTO part of FIG. 16) and there is only amplification by the TR part.

However, it has the fatal disadvantage as high power switching device that the turn-off switching power is locally concentrated in the principle of the turn-off by the gate.

For example, when gate reverse bias is applied in the turn-off step, the turn-off transient current i (off) is concentrated to the arrow line part separated from the gate electrode in FIG. 16 (a) during the time near the maximum switching power before and after the turn-off, that is, during the time of feeding the switching energy.

The embodiment of FIG. 16 has also the disadvantages of the conventional gate turn-off thyristor GTO.

As stated above, the turn-off capable base current is remarkably limited even though the amplification by the transistor TR is improved because of the function of the thyristor GTO itself. Accordingly, the large current should be given by improving the current amplification factor of the transistor TR.

SUMMARY OF THE INVENTION

It is an object of the present invention to overcome the disadvantages of the conventional semiconductor element and to provide a semiconductor element having the self OFF function.

Another object of the invention is to provide a high voltage-large current semiconductor element.

Yet another object of the invention is to provide a semiconductor element in which the turn-off switching power is not locally concentrated to give wide safety operation region.

The foregoing and other objects are attained in accordance with one aspect of the present invention through the provision of a semiconductor element which comprises first, second, third and fourth semiconductor layers wherein the exposed surface of the third semiconductor layer (13) includes the exposed surface faced substantially to the exposed surface of the second semiconductor layer and is brought into ohmic contact with the third B contact and the exposed surface of the fourth semiconductor layer includes the first part which is faced to the first semiconductor layer and is brought into ohmic contact with the third A contact and the second part which is faced to the exposed surface of the second semiconductor layer and is brought into ohmic contact with the second contact.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings in which:

FIG. 1 and FIGS. 3 to 7 are respectively schematic views of various embodiments of the semiconductor elements in accordance with the invention;

FIGS. 8 to 11 are respectively circuit diagrams for illustrating the applications of the semiconductor element of the invention;

FIGS. 12 and 13 are respectively schematic views of the other embodiments of the invention;

FIG. 15 is a schematic view and a symbolic circuit diagram of the other simplified embodiment; and FIGS. 16 (a), (b) are respectively a schematic view and a circuit diagram of the conventional connection of a gate turn-off thyristor and the transistor.

DETAILED DESCRIPTION OF THE PREFERRED EMBODIMENTS

Figure 1A:
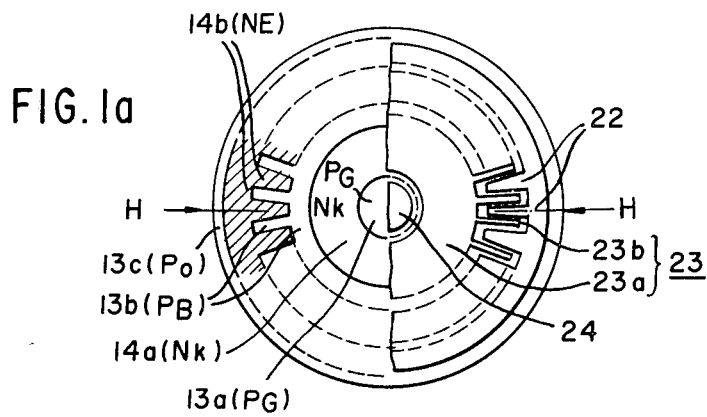
Figure 1B:
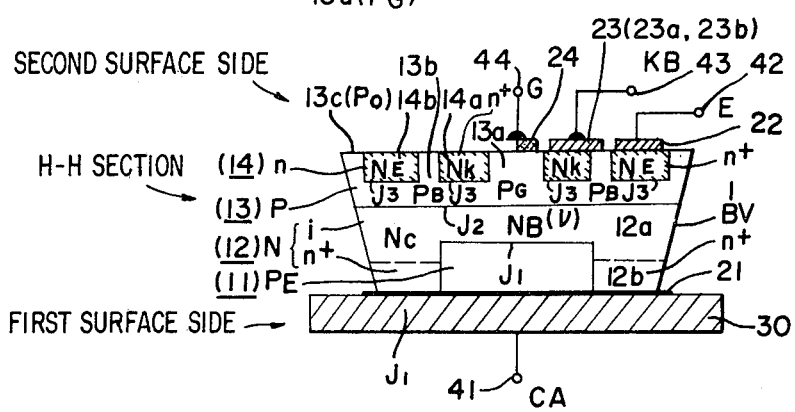

Referring to the drawings, wherein like reference numerals designate identical or corresponding parts through the several views, and more particularly to FIG. 1, FIGS. 1 (a) and (b) are respectively a plan view and a sectional view of one embodiment of a semiconductor element in accordance with the invention. In each left half part, contacts (22) to (24) are omitted and in each right half part, the contacts (22) to (24) are retained.

The embodiment of FIG. 1 is a P-N-P-N type semiconductor element wherein the first semiconductor layer (11), the second semiconductor layer (12), the third semiconductor layer (13) and the fourth semiconductor layer (14) are respectively P-, N-, P- and N- type semiconductor layers.

The first semiconductor layer (11) has an exposed surface at the first surface side which is brought into ohmic contact with the first contact (21) and possesses the central part of the semiconductor wafer (1) at the first surface side.

The second semiconductor layer (12) forms the first PN junction $J_1$ with the first semiconductor layer (11) and has an exposed surface at the first surface side and is brought into ohmic contact with the first contact (21) (which can be a contact which is separated from the contact for the first semiconductor layer and is electrically connected to the contact). The exposed surface of the second semiconductor layer (12) possesses the peripheral part of the first surface of the semiconductor wafer (1).

The third semiconductor layer (13) forms the second junction $J_2$ with the second semiconductor layer (12) and has an exposed surface at the second surface of the semiconductor wafer (1). The exposed surface of the third semiconductor layer (13) has the surface for the gate (13a) which is brought into ohmic contact with the fourth contact (24) and the surface for the base (13b) which is brought into ohmic contact with the third B contact (23b) (a part of the third contact (23)).

The exposed surface for the gate 13a ($P_G$) is disposed in substantially faced to the first semiconductor layer (11) though a discrepancy of about a thickness of the semiconductor wafer in the faced position is allowable.

In the embodiment of FIG. 1, the surface for the gate (13a) possesses the central part of the semiconductor wafer (1) at the second surface side, and is faced to the first semiconductor layer (11). On the other hand, the exposed surface for the base (13b) of the third semiconductor layer (13) is substantially faced to at least the exposed surface of the second semiconductor layer (12).

In the embodiment, the surface for the base (13b) is faced to the exposed surface of the second semiconductor layer (12) and possesses the pattern surface projected into the annular surface (second surface) of the semiconductor wafer (as bias shoreline).

The fourth semiconductor layer (14) forms the third junction $J_3$ with the third semiconductor layer (13) and has an exposed surface at the second surface side. The exposed surface of the fourth semiconductor layer has the first part (14a) which is brought into ohmic contact with the third A contact (23a) which is brought into ohmic contact with the second contact (22).

The first part (14a) faces the first semiconductor layer (11) and the second part (14b) faces the exposed surface of the second semiconductor layer (12).

The first part (14a) and the second part (14b) are respectively the exposed surfaces of the cathode layer 14a ($N_k$) and the emitter layer 14b ($N_e$).

The third A contact is electrically connected to the third B contact. In the embodiment, they are connected by the third contact (23) which is substantially the same and accordingly the manufacture is simple.

In FIG. 1(a), the left half is the second surface pattern which comprises the surface for the gate (13a) of the third semiconductor layer (13), the surface of the first part (14a) of the fourth semiconductor layer(14), the surface for the base (13b) of the third semiconductor layer (13), the surface of the second part (14b) of the fourth semiconductor layer (14) and the surface of the peripheral free part 13c ($P_o$) of the third semiconductor layer (13). In the pattern, the surface (13a) possesses the central small circular part, and the surface (14a) possesses the central large circular part and the surface (13b) possesses a finger surface from the inside of the outer annular part to the outside; and the surface (14b)

possesses a finger surface from the outside of the outer annular part to the inside.

In the pattern of the corresponding exposed surface at the first surface (not shown), in the surface of the first semiconductor layer 11 ($P_e$) possesses the central large circular part and the surface of the second semiconductor layer 12 ($N_c$) possesses the outer annular part. The semiconductor wafer (1) is fixed on a substrate (30) (made of molybdenum of tungsten; and copper or iron coated by silver plating for a small one) to obtain a basic wafer.

The first to fourth contacts (21) to (24) are respectively lead out to connect to the outer electrodes (or terminals) 41 (CA), 42 (E), 43 (KB) and 44 (G).

The semiconductor element having the above-mentioned structure can be prepared by the conventional diffusion method, the epitaxial growth method and the alloy method. The outer connections and the lead out of terminals can be attained by the conventional outer connection method for transistors and thyristors.

Figure 8:
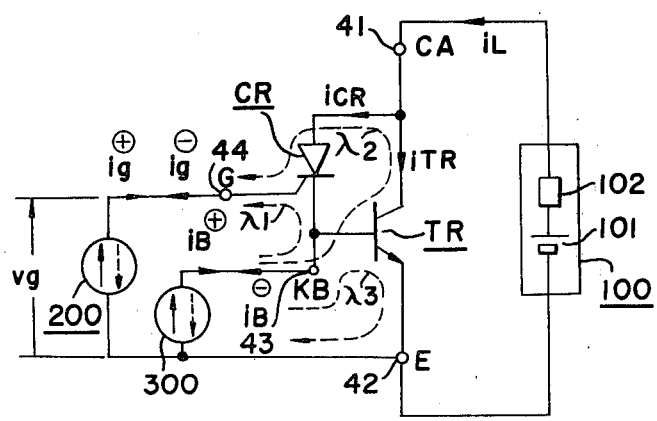

The circuit diagram of the semiconductor element of the abovementioned embodiment is shown by the thick line in FIGS. 8 and 10.

The four layer part of the first to fourth semiconductor layers (central large circular part) is a thyristor CR and the three layer part of the second to forth semiconductor layers (outer annular part) is a transistor TR.

The anode and the cathode of the thyristor are connected across the collector-base junction of the transistor.

The first feature of the embodiment of the invention is to lead out the third electrode 43 (KB) which corresponds to the base terminal of the transistor TR and the cathode terminal of the thyristor CR.

The function and result of the third electrode (43) will be illustrated referring to FIGS. 8 to 10. Briefly, the turn-off of the four layer part can be easily attained by feeding desired pulse current between the base-emitter junction of the three layer part.

The pulse width is the turn-off time of the four layer part. The required pulse voltage is a voltage drop across the base-emitter junction. It is easy to feed the pulse having larger current when the allowable power is the same. Accordingly, the current amplification of the three layer transistor part can be lower such as less than 1, and the thickness of the base layer $P_B$ of the three layer transistor can be thicker than that of the conventional transistor. It is also possible to increase the thickness of the collector part $N_c$ and to increase the thickness of the i layer having high specific resistance (v layer in FIG. 1). Accordingly, the breakdown voltage of the three layer transistor can be easily improved.

The conventional thyristors can be durable to higher voltage in comparison with the conventional transistors. Accordingly, the thyristors are used under applying high voltage. The reason is to utilize the mutual positive feedback function of two transistors (PNP and NPN) which have a lower current amplification factor than that of a single transistor. Accordingly, the thickness of the gate layer $P_G$ of the conventional thyristor is thicker than that of the base layer $P_B$ of the conventionl transistor.

Thus, the three layer transistor part of the device of the invention can be designed in the same manner with that of the second transistor of the four layer thyristor part [the second, third and fourth semiconductor layers (12), (13), (14)]. Accordingly, the base layer $P_B$ and the gate layer $P_G$ can be formed in the same thickness and the same impurity concentration by the same process. The emitter layer $N_E$ and the cathode layer $N_K$ can be formed in the same thickness and the same impurity concentration by the same process. The collector layer $N_c$ and the N side base layer $N_B$ of the four layer part can be also formed by the same process.

As stated above, in the semiconductor element of the invention, the turn-off at the four layer part can be easily attained by leading out the base contact (23b) of the three layer part to the outer terminal. The detail will be described below. The breakdown voltage at the three layer part can be easily increased as that of the four layer part. The current amplification factor of the three layer part can be easily decreased whereby the secondary yield withstand characteristic of the three layer part can be improved to remarkably improve the safety operation region (ASO).

Referring to FIG. 1 the other improvement of the manufacture will be illustrated.

In FIG. 1 a weak N type semiconductor wafer having low impurity concentration (v type) (or a weak P type ($\pi$ type) (referring to i type for them) is used as the low impurity concentration region (12a) of the second semiconductor layer (12). Then, the P type (or N type) first semiconductor layer (11) and the third semiconductor layer (13) are simultaneously formed by the diffusion method or the epitaxial growth method. As the result, layers having the same impurity concentration and the same thickness are formed. Then, the N type (n+type) or P type (p+type) fourth semiconductor layer (14) and the high impurity concentration region (12b) of the second semiconductor layer (12) are simultaneously formed by the diffusion method, the epitaxial growth method or the alloy method.

Thus, the four layer part and the three layer part can be prepared by the simple same process.

The other manufacture is as follows.

After the formation of the first and third semiconductor layers the thickness of the first semiconductor layer is decreased by lapping the first surface (the first semiconductor layer side) to form the high impurity concentration layer (12b) of the second semiconductor layer and the fourth semiconductor layer (14). In this case, the thickness of the high impurity concentration layer (12b) can be same or slightly thicker than that of the first semiconductor layer (11) (thickness after lapping). As the result, the relationship of the thickness of the high impurity concentration layer (12b) (dotted line) and the thickness of the first semiconductor layer (11) is shown in FIG. 3(a).

As stated above, the semiconductor element of the invention can be prepared by a simple process as those of the conventional thyristor when it has the structure of

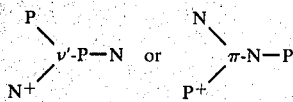

The following function and effect can be attained by disposing a low resistivity layer (12b) at the side of the exposed surface of the secnd semiconductor layer (12).

Figure 2:
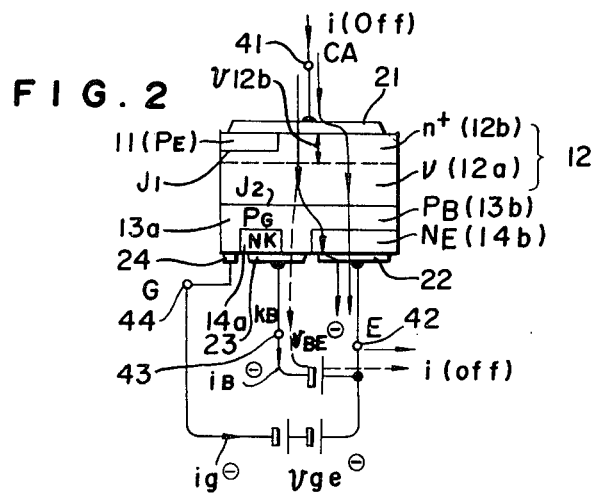
FIG. 2 is a schematic view for illustrating the improved part of the semiconductor element of the invention.

FIG. 2 is a schematic view of the semiconductor element of the invention at the final condition just before the completion of turn-off which is the condition at the time $t_5$ to $t_6$ in the operating waveform of FIG. 9.

In the schematic view of FIG. 2, the side of the first semiconductor layer of FIG. 1 (b) is the upper side.

When the recovery turn-off of the three layer part is performed by the extinction of the four layer part and the turn-off (or the reverse polarity) of the base current for the three layer part in the semiconductor element of the invention, the turn-off transient current i (off) is passed in the full arrow line route shown in FIG. 2. At this time, the voltage drop is caused in the second semiconductor layer (12), and a slight diffusion of the carrier is caused, whereby the first P-N junction $J_1$ at the boundary of the exposed surface at the first surface side across the first semiconductor layer (11) and the second semiconductor layer (12), is forwardly biased to cause the misfiring of the four layer part that is the failure of turn-off.

On the contrary, the voltage drop $V_{12\ F}$ can be decreased to prevent the misfiring by forming the high impurity concentration layer (12b). The diffusion of the carrier can be inhibited by the addition of an impurity by a gold diffusion etc., whereby the misfiring can be prevented.

In the structure of the embodiment of FIG. 1, the following function and effect can be attained by forming an exposed surface of the third semiconductor layer (the exposed surface of the base layer $P_B$ i.e. the partial base surface or the exposed surface of the gate layer $P_G$ i.e. the partial gate surface and the former in FIGS. 1 and 2 near the boundary of the exposed surface between the first semiconductor layer (11) and the second semiconductor layer that is the boundary region between the four layer part and the three layer part (below the boundary line in the schematic view of FIG. 2).

In the schematic view of FIG. 2, the reverse bias $\ominus V_{BE}$ (or $\ominus V_{ge} \sim \ominus V_{gk}$) is applied across KB-E (or across G-KB or G-E in the latter) at the time of the completion of turn-off or they are connected by a low impedance, or at least base surface part of the exposed surface of the third semiconductor layer and the surface of the fourth semiconductor layer (14) at the first surface side form the short-circuit (the third B contact (23b) is connected to the third A contact (23a) at the faced position near the boundary line. The current (the dotted arrow line) which is passed into the fourth semiconductor layer ($N_k$) of the four layer part under the diffusion of the transient turn-off current i (off) of the three layer part can be prevented by either of the above-mentioned manners. That is, the emission of the carriers from the fourth semiconductor layer of the four layer part to the base region of the three layer part, is prevented, and the misfiring of the four layer part at the completion of turn-off can be prevented.

The semiconductor element of the invention need not to have the reverse breakdown voltage whereby the bevelling BV can be only positive bevel. Accordingly, the bevel angle is large and the area efficiency of the semiconductor wafer is high. FIG. 3 (a) is a schematic sectional view of the other embodiment of the invention. The pattern at the second surface side can be those of FIG. 1 (a) or FIG. 5.

In the embodiment of FIG. 3, the exposed surface at the second surface side of the third semiconductor layer (13) is face to the exposed surface at the first surface side of the first semiconductor layer (11) and a part $P_s$ (13c) of the exposed surface (the outer peripheral part to the outer annular part in the embodiment shown in FIG. 3) is brought into ohmic contact with the second contact (22). Thus, the two layer PN junction region $X_1$ (part of the second junction $J_2$) is formed.

The circuit connection diagram of the semiconductor element is shown in FIG. 3 (b). That is, it corresponds to the reverse parallel connection of the diode part $D_x$ to the three layer transistor.

In accordance with the embodiment of the invention, the reverse voltage breakdown of the three layer part can be prevented because of low reverse voltage. Moreover, it is possible to give the optimum design wherein the semiconductor layers are arranged to only the direction of the forward blocking voltage and the forward current characteristic whereby the forward blocking voltage and the voltage drop can be improved. It is also possible to use the diode part by feeding the current to the diode part.

FIGS. 4 (a), (b) are respectively schematic sectional views of the other embodiments of the invention in the negative bevel.

FIG. 4 (a) shows the embodiment of the three layer—four layer composite type and FIG. 4 (b) shows the embodiment of the two layer—three layer—four layer composite type which has the two layer part $X_1$. In FIG. 4 (b), only ½ of the sectional view is shown.

The pattern at the second surface side of FIG. 4 can be those of FIG. 1 (a) or FIG. 5 (a).

As shown in FIG. 1 and FIG. 4 (a), the exposed surface (13c) of the third semiconductor layer is formed at the peripheral part by the method of forming the third semiconductor layer $P_o$ ($n_o$ in the structure of

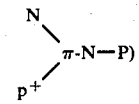

which is exposed at the second surface side of the wafer peripheral part, or the method of forming the third semiconductor layer $P_s$ ($N_s$ in the structure of

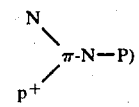

(see FIG. 7) which is exposed at the second surface side of the wafer peripheral part to short-circuit to the second contact (22) or the third A contact (23a) or the method of forming the third semiconductor layer exposed at the second surface side of the wafer peripheral part which is brought into contact with the third B contact (not shown) as the base surface or with the fourth contact as the gate surface (see FIG. 6), whereby the current leakage and the insulation breakdown near the peripheral part of the third semiconductor layer (13) having a short distance at the peripheral surface, can be easily prevented. This is, the insulation at the peripheral parts of the second junction $J_2$ and the third junction $J_3$ can be easily improved. Especially, the insulation breakdown and the deterioration of insulation between the second semiconductor layer and the fourth semiconductor layer can be prevented by the forward voltage applied to the second junction $J_2$.

FIG. 5 is a plan view of the other embodiment of the pattern of the semiconductor element of the invention at the second surface side.

In FIG. 5 (a), the half left part is the pattern of the exposed surface of the semiconductor wafer having no contact and the half right part is the pattern having the contact. FIG. 5 (b) is a partially enlarged view of the pattern having the contact.

The embodiment has the pattern wherein the gate part surface (13a) ($P_G$) ($N_G$ in the structure of N-$\pi$-N-P type) of the third semiconductor layer (13) and the first part surface (14a) ($N_k$) ($P_A$ in the structure of N-$\pi$-N-P type) of the fourth semiconductor layer (14) are projected each other. Accordingly, the fourth contact (24) is on the gate part surface and the third A contact (23a) is on the first part surface and they are projected each other. That is, the gate pattern of the four layer part is formed by the projected finger pattern whereby the turn-off characteristic of the semiconductor element can be improved. Especially, the referring phenomenone at the four layer part can be prevented at the time of the completion of turn-off whereby the reverse bias time tq and the base pulse current which are required for the turn-off $i_B^{\oplus}$ and tq in FIG. 9) can be decreased.

The function is as follows. In the schematic view of FIG. 2, the current intends to pass from the first semiconductor layer (11) to the third A contact (23a) by the diffusion of carriers caused by the turn-off transient current i (off) (at before or after the initiation and the course of rising the forward voltage across CA-E) which passes through the four layer part shown by the full line and the residual carriers in the four layer part. That is, both of the forward recovery current at the four layer part of the second junction J$_2$ and a part of the forward recovery current at the three layer part intend to pass to the four layer part. In this case, the gate reverse bias $\ominus$ vge is applied across G-E or across G-KB (across G-AB in the structure of N-$\pi$-N-P type) (see FIG. 7) whereby the forward recovery current at the four layer part is discharged from the fourth contact (24) as $i_g^{\ominus}$ to prevent the reach of the current to the fourth semiconductor layer (14a). The effect for preventing the reach of the current can be attained by the projected gate pattern.

The structure of the four layer part which attain the effect is similar to that of the gate turn-off thyristor. However, it is not forcibly turned off by a gate and it is a gate auxiliary turn-off system for preventing the failure of turn-off by the auxiliary effect of the gate reverse bias at the time of rising the forward voltage. The allowable current density at the four layer part is remarkably high in comparison with the conventional system using the gate turn-off thyristor.

In the four layer part structure designed as a gate turn-off thyristor, the current for the four layer part which can be turned off by feeding the base pulse current to the three layer part can be remarkably improved and the damage of the four layer part caused by the switching power and the local distribution thereof can be prevented. When the same current for the four layer part which can be turned off is fed, the gate pattern can be simple and the projects can be rough and the occupation factor of the first part surface can be improved to be smaller area of the wafer.

Figure 6A:
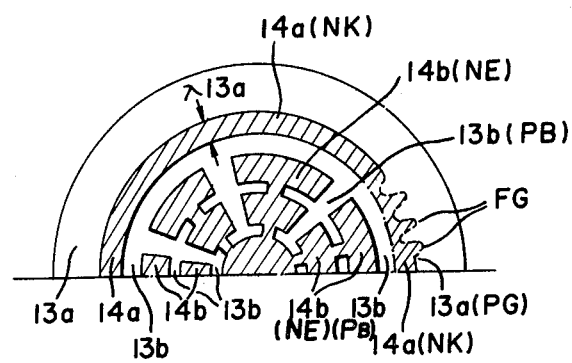
Figure 6B:
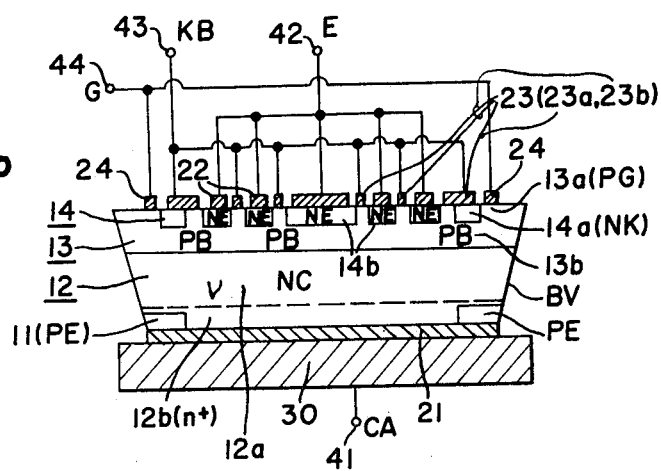
Figure 6C:
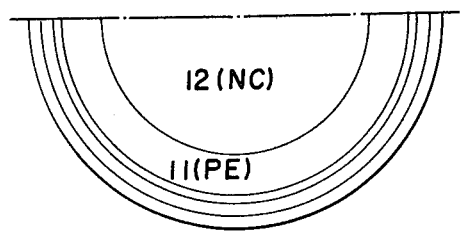

FIG. 6 shows the other embodiment of the invention wherein the first semiconductor layer (11) the first part (14a) of the fourth semiconductor layer and the gate part (13a) of the third semiconductor layer are disposed at the outer annular part (the four layer part is disposed at the outer annular part) and the exposed surface of the second semiconductor layer, the second part (14b) of the fourth layer and the base part (13b) of the third semiconductor layer disposed at the inner circular part (the three layer part is disposed at the inner circular part. FIG. 6(a) is a pattern view of the exposed surface (half) at the second surface side from which the contact is taken out, and FIG. 6(b) is a sectional view thereof and FIG. 6(c) is a pattern view of the exposed surface (half) at the first surface side from which the contact is taken out. Various projected patterns can be given instead of the pattern of FIG. 6(a).

As shown in FIG. 6, when the four layer part is the outer annular part, a large area can be easily given even though the width $\lambda 13a$ of the second part (13b) of the fourth semiconductor layer (13) is narrow. Accordingly, it is possible to attain the function and the effect (to prevent a referring by the gate reverse bias at the time of the reapplication of forward voltage just after the turn-off) as those of FIG. 5 without forming a complicated finger type pattern for the gate surface in the case of the semiconductor element having relatively small capacity.

It is also possible to attain the function and the effect to prevent a referring by slight projections as shown by the dotted line FG of FIG. 6(a) even though it is a relatively large current semiconductor element. Thus, the embodiment of FIG. 8 has the characteristics to easily impart the gate reverse bias effect of the four layer part.

Figures 7A, 7B:
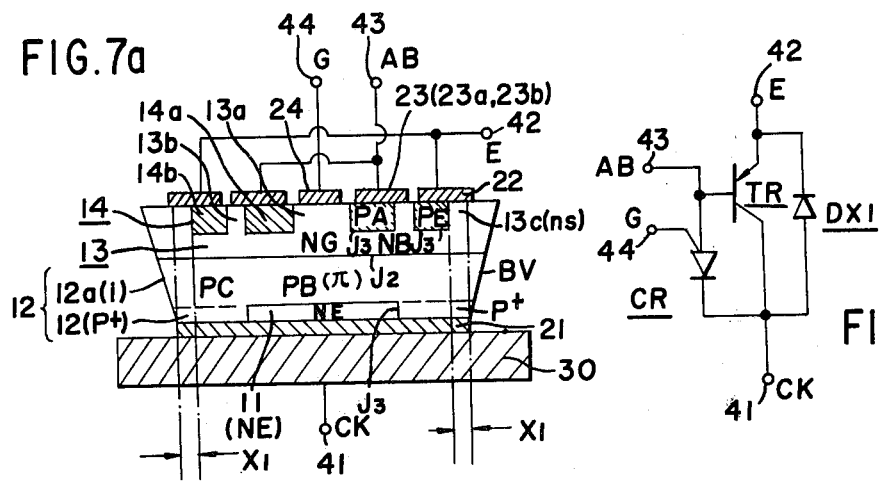

FIG. 7 shows the other embodiment of the invention. FIG. 7(a) is a schematic sectional view of the

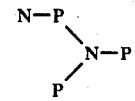

type element. FIG. 7(b) is a circuit connection diagram thereof.

The pattern of the embodiment at the second surface side can be those of FIG. 1 and FIG. 5(a).

It is also possible to dispose the four layer part at the outer annular part.

It is also possible to form the two layer diode $X_1(D_{X1})$ as shown in FIG. 3.

In the embodiment of FIG. 7, the reverse conductive low impurity concentration (i) layer (12b) ($\pi$ type in the drawing) and the high impurity concentration layer (P+ type in the drawing) can be formed to give

type.

As shown in FIG. 7, the embodiments of FIGS. 1 to 6 can be modified to the semiconductor elements having the reverse conductive semiconductor layer.

In FIG. 8, the three layer transistor part TR is a main current feeding element and the four layer thyristor part CR is used as a base current feeding element and a shunt element for a part of the main current.

In FIG. 8, the main circuit network (100) comprises the power source (101) and the load (102).

When the semiconductor element of the invention is turned off the initial gate current i gi is fed to the gate (across G-E or across G-KB) of the four layer part CR, and then the gate current $i_g\oplus$ or, the repeating gate pulse train $i'_g$ are subsequently given. The waveform of the current in the operation are shown in FIG. 9(b) and are given by the gate controlling means (200).

On the other hand, the shunt current $i_{CR}$ of the main current is fed as the base current of the three layer part whereby the collector current $i_{TR}$ is fed and the current $i_L=(i_{CR}+i_{TR})$ is fed to the emitter.

It is also possible to feed the initial turn-off pulse base current $i_{Bi}$ (FIG. 9(a) dotted line) from the base controlling means (300) to the three layer part at the turn-off initiation. In this case, the rising allowance $di_L/dt$ of the main current $i_I$ is increased.

When the initial turn-off base current $i_{Bi}$ is gradually decreased as shown by the dotted line in FIG. 9(a), the firing area spreading speed in the four layer part CR can be in harmony whereby the turn-off transient voltage drop at the four layer part can be decreased.

It is also possible to feed the normal base current $I_B$ (shown by the chain line in FIG. 9(a) by the base controlling means (300) during the normal state. In this case, it has the effect for decreasing the collector voltage drop when a relatively small load current is fed, whereby the current compensating for the shortage of the base current during the time feeding a large load current, is fed from the four layer part CR. It is possible to self-supply the transforming current for the main current $i_L$ by a current transformer as the source of the base controlling means (300) for feeding the base current $I_B$ in the normal state.

When the semiconductor element of the invention is turned off, the turn-off base pulse current $I_B$ pulse can be forwardly fed by the base controlling means (300). This is shown by the thick line $I_B$ pulse in FIG. 9 (a). By the turn-off base pulse current, the voltage drop $V_{KE}$ across the base-emitter (KB-E) of the three layer part is increased whereas the voltage drop $V_{CE}$ across the collector-emitter (CA-E) of the three layer part is decreased. That is, the four layer part CR is reversely recovered by the reverse voltage in $V_{CE} \leqq V_{KE}$.

Even though the current $I_B$ pulse is relatively small in $V_{CE} \geqq V_{KE}$, the path of the main current $i_L$ is maintained by the three layer part. When the four layer part has a structure of the gate turn-off thyristor (FIG. 5), it is easy to turn-off it by the gate reverse bias $\{i_g\ominus, V_g\ominus$ in FIG. 9(b), (c)\}. That is, the gate turn-off of the four layer part CR is given under the condition for inhibiting the forward voltage rise by the three layer part TR. Accordingly, the gate turn-off is easy.

The pulse base current $I_B$ pulse for the turn-off can be fed only during the turn-off time tq.

In order to shorten the turn-off time of the four layer part, the life time of the semiconductor layers (especially the second and third semiconductor layers) can be shortened by the gold diffusion into the semiconductor element. Moreover, the turn-off time tq can be remarkably shortened by auxiliary applying the gate reverse bias. As the result, the turn-off time tq can be shortened in a range of 3 $\mu$sec $\sim$ several tens $\mu$sec.

Accordingly, when the turn-on and -off is given in a period enough longer than the turn-off time tq (under the normal conditions), the power $P_B$ pulse for the current $I_B$ pulse can be given by the following equations.

$$P_B \text{ pulse} = V_{BE} \cdot I_B \text{ pulse} \cdot \frac{tq}{T} \quad (1)$$

-continued
$$= V_{BE} \cdot \frac{I}{h_{FE}} \cdot \frac{tq}{T}$$

wherein
$V_{BE}$: voltage drop across the base-emitter by the current $I_B$ pulse
T: ON-OFF period
$h_{FE}$: current amplification factor of the three layer part TR
I: current for load being turned off As the reference, the power of the commutating pulse required for the extinction by the anode reverse bias of the conventional thyristor is given by the equation $$P_c \geqq E \cdot I \cdot \frac{tq}{T} \quad (2)$$

wherein E: forward voltage for the thyristor being turned-off

The following equation is given by the ratio of (1) to (2)

$$\frac{P_B \text{ pulse}}{P_c} \leqq \frac{V_{BE}}{E} \cdot \frac{1}{h_{FE}} \quad (3)$$

Even though $h_{FE} \approx 1$, the pulse power can be ($V_{BE}/E = 1$/several tens to several hundreds) in the semiconductor element of the invention.

In the base controlling means (300) for the pulse power, the output of the secondary winding $N_2$ is applied across the base-emitter by the pulse transformer (pulse current transformer), and the pulse current source is connected to the primary winding $N_1$, and the turn ratio is in the order of $$\frac{N_2}{N_1} \approx \frac{V_{BE}}{E},$$

the pulse current required for the pulse current source can be only 1/several tens to several hundreds of the main current being turned off.

As clearly understood by the example, the base controlling means (300) required for the turn-off of the semiconductor element of the invention can be remarkably simple in comparison with the conventional thyristor.

On the other hand, when only three layer transistor is used, it is difficult to continuously feed the base current to the transistor having the current amplification factor of $h_{FE} \approx 1$ during the ON period, and the base loss is high.

In accordance with the embodiment of the semiconductor element of FIG. 8, the base current is self-supplied in the element across the four layer part CR, and is a partial current for the load current $i_L$ to effectively support the main current. Accordingly, it is easy to give high breakdown voltage such as 1200 to 2500 V.

As it is clearly understood from the above description, the semiconductor element of the invention can be practically used without a trouble even though the current amplification factor of the three layer part TR is remarkably decreased.

FIG. 9(c) shows the waveform of the gate voltage $V_g$ corresponding to the current $i_{200}$ of the gate controlling means (200) shown in FIG. 9(b) in the embodiment of FIG. 8.

FIG. 9(d) shows waveforms of the load current $i_L$, the four layer part current $i_{CR}$ and the three layer part current $i_{TR}$.

The waveforms are formed by feeding the initial turn on base current $i_{Bi}$ as shown by the dotted line of FIG. 9(a) at the initial stage of turn-on. In this case, the three layer part current $i_{TR}$ rises and then the four layer part current rises.

The turn-off can be hastened by applying the base reverse bias $i_B\ominus$ at the turn-off completion period of the three layer part TR.

When the load current $i_L$ increases to the order of the peak maximum current during the normal ON period, the current amplification factor of the three layer part TR is decreased. However, in accordance with the invention, the current in the four layer part CR can be increased whereby the excess current durability is high. For example, the condition of $i_{CR} > i_{TR}$ can be allowed. The condition is shown by the convex waveform during the period $t_3$ to $t_4$, in FIG. 9(d).

In the embodiment of FIG. 8, the first electrode (41) and the second electrode (42) are the main electrodes and the third electrode (43) and the fourth electrode (44) are the control electrodes.

FIG. 10 is a circuit connection diagram of the other embodiment of the semiconductor element of the inventor.

In the embodiment, the first electrode (41) and the third electrode (43) {especially the large current conductive lead out in the side of the 3A contact on the first part (14a) of the fourth semiconductor layer (14)} are the main electrodes. The four layer part CR is main conductive part.

In FIG. 10(a), the semiconductor element has the base controlling means wherein the second winding $N_2$ of the pulse current transformer (302) is connected across the third electrode (43) and the secnd electrode (42) and the primary winding $N_1$ is connected to the pulse current source (301). The first electrode (41) and the third electrode (43) are connected in series in the main current path for the main load current $i_L$.

FIG. 10(b) shows waveforms of the main current $i_L$, the four layer part current $i_{CR}$, the third electrode current $i_{KB}$ and the fourth electrode current $i_E$ (substantially proportional to the current $i_{N1}$ for the primary winding of the current transformer (302) in the embodiment of FIG. 10(a). The three layer part current $i_{TR}$ and the current $i_E$ are shown by the dotted line.

In the embodiment, the gate current is fed to the four layer part CR to feed the main current to the four layer part.

When it is turned off, the second electrode current $i_E$ is fed by the base control means (300) that is the potential of the second electrode (42) to the potential of the third electrode (43) is changed, to apply the forward bias to the three layer part TR. That is, the base current $i_B$ is fed and the main current $i_L$ is commutated to the three layer part TR. For example, the potential of the emitter is lower than the potential of the base-cathode KB for the value of $V_{KB-E}$, whereas the potential of the cathode K is higher than the potential of the emitter E for the value of $V_{KB-E}$. Accordingly, the potential of the collector-anode CA is decreased depending upon the lowering of the potential of the emitter E. The four layer part CR is extinguished under the reverse bias (or low voltage, small current).

It is possible to accelerate the turn-off of the four layer part by applying the gate reverse bias through the diode $D_g$ to the four layer part CR by connecting the third winding $N_3$ of the current transformer.

When the pulse voltage (or pulse current) given by the base controlling means (300) is broken down or the pulse voltage having reverse polarity is applied, after the time tq the three layer part is turned off to complete the turn-off of the semiconductor element of the invention.

When the gate reverse bias is applied to the four layer part during the turn-off completion period $t_{56}$, the time tq required for the turn-off can be shortened even in this embodiment.

It is clear that the embodiment of FIG. 10 can be applied for the

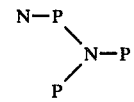

type element.

In the embodiment of FIG. 10, the control pulse current for the turn-off is disadvantageously high however, the voltage drop and the loss can be smaller than those of the embodiment of FIG. 8 because the voltage drop in the normal state is only the voltage drop in the four layer part.

FIG. 11(a) (b) are the circuit connection diagrams of the other embodiments wherein the fourth electrode (44) (gate electrode G) is connected to the second electrode (42) (emitter electrode E) and the controlling means (400) is connected between the second contact (42) and the third electrode (43) (base electrode KB).

FIG. 11(a) shows the connection for feeding the main current $i_L$ across the first electrode (41) and the second electrode (42) (the three layer part TR).

FIG. 11(b) shows the connection for feeding the main current $i_L$ across the first electrode (41) and the third electrode (43) (the four layer part CR).

In FIG. 11(a), when the control voltage $V_{400}$ is applied in the positive polarity shown by the arrow line in the case of the turn-on by the controlling means (400), the turn-on current $i_{on}$ is fed through (400)-(42)-(44)-CR-(43)-(400) to the gate of the four layer part CR, to turn-on it.

The condition of the current after the turn-on is similar to that of the embodiment of FIG. 8.

When the control voltage $V_{400}$ is applied in the negative polarity by the control means (400) in the case of the turn-off, the forward pulse current $i_{off}$ is fed through (400)-(43)-TR(42)-(400) to the base of the three layer part TR to turn-off the four layer part CR.

The turn-off operation is similar to that of the embodiment of FIG. 8. Thus, the gate reverse bias is applied through (400)-(43)-CR-(44)-(42)-(400) of the four layer part CR by the pulse current $i_{off}$, whereby the turn-off of the four layer part CR is promoted by the current $i_{off}$.

The turn-on operation of the embodiment of FIG. 11(b) is similar to that of FIG. 11(a). Thus, the turn-off operation is similar to that of the embodiment of FIG. 10 during the ON period. That is, the potential of the terminal (42) is decreased in the turn-off operation to feed the base current to TR and the main current $i_L$ is fed to TR. In this case, the gate reverse bias is applied through (400)-(43)-CR-(44)-(42)-(400) to CR.

It is clear that the embodiment of FIG. 11 can be applied for the

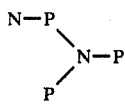

type element (FIG. 7 etc.).

In the embodiment of FIG. 11, the controlling means can be a pair and can be simplified by the two terminal control.

The embodiment of FIG. 11 shows the possibility for decreasing the number of the outer lead electrodes required for the semiconductor element of the invention.

FIGS. 12 to 15 show the embodiments of the semiconductor elements of the invention wherein the number of the outer lead electrodes in decreased.

Figure 13A:
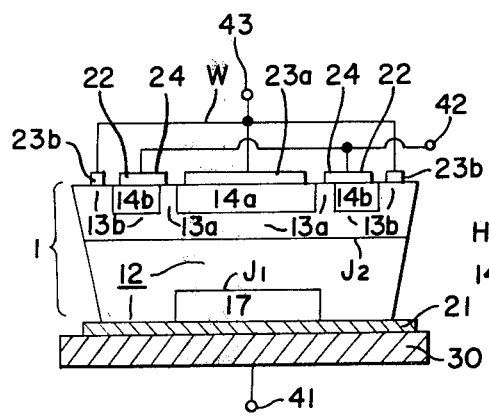
Figure 13B:
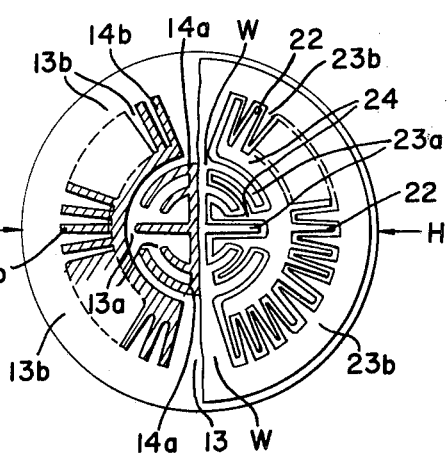

The structures of the semiconductor layers of the semiconductor wafer (1) of FIGS. 12 and 13 are similar to those of FIGS. 1 to 7.

In the embodiment of FIG. 12, the gate part (130) of the third semiconductor layer (14) is exposed on the region surrounded (or held) by the first part (14a) of the fourth semiconductor layer (14), and the fourth contact (24) is brought into ohmic contact with the exposed surface to connect it to the second contact (22).

The connection can be attained by connecting them as the substantially same contact in the plan pattern at the second surface side or by the jumper line.

The former embodiment of the plan contact pattern is shown in FIG. 12(b) wherein the left half part is the pattern of the exposed surface without the contact and the right half part is the contact pattern.

In FIG. 12, W designates a contact for connecting the fourth contact (24) to the second contact (22), and the connecting part contact W is brought into contact with the exposed surface of the third semiconductor layer (13). That is, the exposed surface of the first part (14a) of the fourth semiconductor layer (14) is departed near the W line.

The base part (13b) of the third semiconductor layer (13) is exposed in the zone held (or surrounded) by the first part (14a) and the second part (14b) of the fourth semiconductor layer (14) and the exposed surface is brought into ohmic contact with the third B contact (23b). On the other hand, the third A contact (23a) brought into ohmic contact with the first part (14a) of the fourth semiconductor layer (14) is connected to the 3B contact (23b) to substantially form the common third contact (23).

The second part (14b) of the fourth semiconductor layer (14) is brought into ohmic contact with the second contact (22).

The first contact is similar to those of FIGS. 1 to 7. Thus, the first contact (21), the second contact (22) and the third contact (23) are respectively lead out as the first electrode (41), the second electrode (42) and the third electrode (43) to the out of the case of the semiconductor element.

In the embodiment of FIG. 13, the gate part (13a) of the third semiconductor layer (13) is exposed on the region held (or surrounded) by the first part (14a) and the second part (14b) of the fourth semiconductor layer and is brought into contact with the fourth contact (24), and the second contact (22) is brought into ohmic contact with the exposed surface of the second part (14b) of the fourth semiconductor layer (14).

The fourth contact (24) and the adjacent second contact (22) are connected by the substantially common contact (24, 22), and the common contact is lead out as the second electrode (42).

On the other hand, the base part (13b) of the third semiconductor layer (13) is exposed to the surface which is adjacent to the exposed surface of the second part (14b) of the fourth semiconductor layer (14) and is also adjacent to the exposed surface of the gate part (13a) at the opposite side. The base part (13b) is brought into ohmic contact with the third B contact (23b).

The third B contact (23b) is connected to the third A contact (23a) which is brought into ohmic contact with the exposed surface of the first part (14a) of the fourth semiconductor layer (14) and it is lead out as the third electrode (43).

The connection can be attained by the contact pattern itself or the jumper line in the second plan pattern.

FIG. 13 (b) shows the connection by the plan pattern, which is the embodiment having the exposed surface pattern wherein the gate part (13a) and the first part (14a) are projected each other.

Figure 14A:
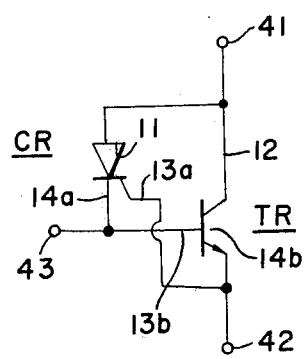
FIG. 14 is a symbolic circuit diagram for the embodiments shown in FIGS. 12 and 13.
Figure 14B:
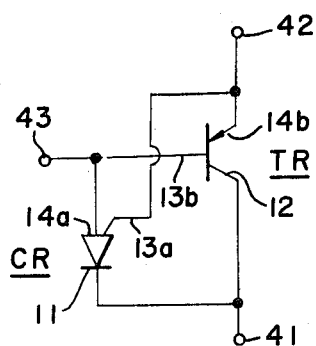

By the structure, the embodiments of FIGS. 12 and 13 can be shown by the circuit connection diagrams shown in FIG. 14 (a) or (b).

The embodiment of FIG. 14 (a) has the

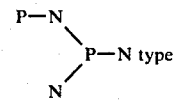

structure or the embodiment of FIG. 14 (b) has the

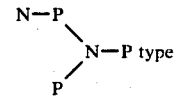

structure.

FIG. 15 (a) is a schematic sectional view of the other embodiment wherein the first part (14a) and the second part (14b) of the fourth semiconductor layer (14) are connected (as shown by the full line), or are separated by the free exposed part (13c) of the third semiconductor layer (13) (as shown by the dotted line).

The base part (13b) of the third semiconductor layer has the exposed surface and is brought into ohmic contact with the third B contact (23b), and is lead out to the third electrode (43) together with the 3A contact (23a) contacted with the exposed surface of the first part (14a) of the fourth semiconductor layer. The gate part (13a) of the third semiconductor layer (13) is not lead out.

The breakdown voltage at the third junction J3 between (13b) and (14b) is preferably low. That is, the concentration of the impurity is preferably high, and the fourth semiconductor layer (14) is preferably formed by the epitaxial growth method.

The second part (14b) of the semiconductor layer is lead out through the second contact (22) to the second terminal (42).

As stated above, the circuit connection diagrams of the semiconductor element can be shown as those of FIGS. 15 (b), (c). FIG. 15 (b) shows

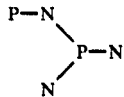

type structure and FIG. 15 (c) shows

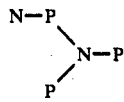

type structure. In FIGS. 15 (b), (c), the references $R_{ke}$ and $R_{ae}$ designates the sheet resistance between the third A contact (23a) of the fourth semiconductor layer (14) and the second contact (22). The sheet resistance can be increased by separating it by the formation of the free third semiconductor layer (13c).

The reference $R_{gb}$ designates the sheet resistance between the first part (13a) and the second part (13b) of the third semiconductor layer.

In the semiconductor element, the control voltage is applied in the reverse direction across the second terminal (42) and the third terminal (43) that is the base-emitter of the three layer part TR (between 13b–14b), the fourth layer part CR is triggered through the sheet resistance $R_g$ (between 13b–13a) by the breakdown across them, whereby the four layer part is triggered. Accordingly, they have the effect being substantially the same with those of the embodiments shown in FIGS. 12 and 13.

As stated above, the semiconductor elements of the invention shown in FIGS. 12 to 15 can be used in the connections as those of FIGS. 11 (a) and (b). The four layer part is easily turned off by the commutation to the three layer part TR as similar to those of the embodiments shown in FIGS. 1 to 7, and it can be practically used even though the current amplification factor of the three layer part TR is low. Accordingly, the semiconductor element for high voltage and large power can be easily obtained and the safety operating region can be easily improved in high degree. Moreover, the three layer part can be easily formed by the thicknesses of the semiconductor layers or the distribution of the concentration of the impurity.

In the above-mentioned embodiments, the third A contact and the third B contact are lead out as one terminal. Thus, it is possible to lead out to the outer electrode, separately.

As stated above in detail, the turn-off operation with the different quality can be attained by leading out the base layer (13b) of the three layer part.

The semiconductor elements of the invention has the three surface TR and the fourth layer part CR. The conductivity of the three layer part is maintained during the turn-off transient period of the four layer part by leading out the base layer (13b) of the three layer part to the outer terminal.

What is claimed is:

1. A semiconductor device adapted to be connected in a main current carrying path and switched between a high and a low impedance state comprising:
(A) four electrodes including
  (a) a pair of main electrodes (41), (43) adapted to be connected in the main current carrying path,
  (b) a gating electrode (44) for switching the semiconductor device to the low impedance state from the high impedance state, and
  (c) a turn-off controlling electrode (42) for switching the semiconductor device to the high impedance state from the low impedance state;
(B) first semiconductor means including
  a first semiconductor region consisting of four layers with alternate layers of opposite conductivity type thereby forming a thyristor with two outer layers and two inner layers,
  the outer layers of the thyristor directly connected between the pair of main electrodes (41), (43), and one of the two inner layers of the thyristor electrically connected to the gating electrode (44),
  the thyristor through which most of the current of the main current carrying path passes is in its low impedance state;
(C) second semiconductor means including
  a second semiconductor region having three alternate layers of opposite conductivity type thereby forming a transistor with two outer layers of one conductivity type separated by a base layer of opposite conductivity type,
  the two outer layers of the transistor electrically connected between the turn-off controlling electrode (42) and one (41) main electrode, and the base layer of the transistor electrically connected to the other (43) main electrode; and
(D) turn-off controlling means (300 or 400) connected between the turn-off controlling electrode (42) and the other (43) main electrode for applying a pulse to the turn-off controlling electrode to turn on the transistor and to turn off the thyristor and for subsequently removing the pulse to turn off the transistor; wherein
(E) the transistor is made conductive only by said pulse.

2. A semiconductor device adapted to be connected in a main current carrying path and switched between a high and a low impedance state comprising:
(A) three electrodes including
  (a) a pair of main electrodes (41), (43) adapted to be connected in the main current carrying path, and
  (b) a turn-off controlling electrode (42) for switching the semiconductor device to the high impedance state from the low impedance state;
(B) first semiconductor means including
  a first semiconductor region consisting of four layers with alternate layers of opposite conductivity type thereby forming a thyristor with two outer layers and two inner layers,
  the outer layers of the thyristor directly connected between the pair of main electrodes (41), (43), and one of the two inner layers of the thyristor electrically connected to the turn-off controlling electrode (42),
  the thyristor through which most of the current of the main current carrying path passes is in its low impedance state;
(C) second semiconductor means including
  a second semiconductor region having three alternate layers of opposite conductivity type thereby forming a transistor with two outer layers of one conductivity type separated by a base layer of opposite conductivity type, the two outer layers of the transistor directly connected between the turn-off controlling electrode (42) and one (41) main electrode, and the base layer of the transistor electrically connected to the other (43) main electrode; and
(D) turn-off controlling means (300 or 400) connected between the turn-off controlling electrode (42) and the other (43) main electrode for applying a pulse to the turn-off controlling electrode to turn on the transistor and turn off the thyristor and for subsequently removing the pulse to turn off the transistor; wherein
(E) the transistor is made conductive only by said pulse.

3. A semiconductor device adapted to be connected in a main current carrying path and switched between a high and a low impedance state comprising:
(A) three electrodes including
   (a) a pair of main electrodes (41), (43) adapted to be connected in the main current carrying path,
   (b) a turn-off controlling electrode (42) for switching the semiconductor device to the high impedance state from the low impedance state;
(B) first semiconductor means including
   a first semiconductor region consisting of four layers with alternate layers of opposite conductivity type thereby forming a thyristor with two outer layers and two inner layers,
   the outer layers of the thyristor directly connected between the pair of main electrodes,
   the thyristor through which most of the current of the main current carrying path passes is in its low impedance state;
(C) second semiconductor means including
   a second semiconductor region having three alternate layers of opposite conductivity type thereby forming a transistor with two outer layers of one conductivity type seperated by a base layer of opposite conductivity type,
   the two outer layers of the transistor electrically connected between the turn-off controlling electrode (42) and one (41) main electrode, the base layer of the transistor electrically connected to the other (43) main electrode, and one of the two inner layers of the thyristor electrically connected to the base layer of the transistor,
(D) turn-off controlling means (300 or 400) connected between the turn-off controlling electrode (42) and the other (43) main electrode for applying a pulse to the turn-off controlling electrode to turn on the transistor and to turn off the thyristor and for sequentially removing the pulse to turn off the transistor; wherein
(E) the transistor is made conductive only by said pulse.

4. The semiconductor element recited in claim 1 wherein said turn-off controlling means is comprised of a pulse transformer and a pulse current source; said pulse current source being connected in series with the primary winding of said pulse transformer and the secondary winding of said pulse transformer being connected across the turn-off controlling electrode (42) and the other main electrode (43).

5. The semiconductor element recited in claim 1 wherein said gating electrode (44) is connected directly to said turn-off controlling electrode (42) and said turn-off controlling means is connected between said turn-off controlling electrode and the other main electrode (43).

* * * * *